(12) United States Patent
Yamauchi et al.

(10) Patent No.: US 11,814,502 B2
(45) Date of Patent: Nov. 14, 2023

(54) RESIN COMPOSITION, RESIN FILM, METAL FOIL WITH RESIN, PREPREG, METAL-CLAD LAMINATE, AND PRINTED WIRING BOARD

(71) Applicant: Panasonic Intellectual Property Management Co., Ltd., Osaka (JP)

(72) Inventors: Akihiro Yamauchi, Osaka (JP); Eiichiro Saito, Osaka (JP); Nobuo Shibata, Osaka (JP); Kouichi Aoki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 59 days.

(21) Appl. No.: 17/771,079

(22) PCT Filed: Oct. 21, 2020

(86) PCT No.: PCT/JP2020/039516
§ 371 (c)(1),
(2) Date: Apr. 22, 2022

(87) PCT Pub. No.: WO2021/079900
PCT Pub. Date: Apr. 29, 2021

(65) Prior Publication Data
US 2022/0372245 A1 Nov. 24, 2022

(30) Foreign Application Priority Data
Oct. 25, 2019 (JP) .................................. 2019-194706

(51) Int. Cl.
*C08K 3/26* (2006.01)
*C08J 5/24* (2006.01)
(Continued)

(52) U.S. Cl.
CPC ................. *C08K 3/26* (2013.01); *C08J 5/249* (2021.05); *C08K 3/22* (2013.01); *C08K 9/06* (2013.01);
(Continued)

(58) Field of Classification Search
CPC ... C08K 3/26; C08K 3/22; C08K 9/06; C08K 2003/2227; C08K 2003/267;
(Continued)

(56) References Cited

U.S. PATENT DOCUMENTS 11,617,261 B2 * 3/2023 Yamauchi ............... C08L 63/00
428/327
2011/0135911 A1 6/2011 Maenaka et al.
(Continued)

FOREIGN PATENT DOCUMENTS

JP 2006-291078 A 10/2006
JP 2012-087250 A 5/2012
(Continued)

OTHER PUBLICATIONS

JP 2005272752 A English translation (Year: 2005).*
(Continued)

*Primary Examiner* — Betelhem Shewareged
(74) *Attorney, Agent, or Firm* — GREENBLUM & BERNSTEIN, P.L.C.

(57) ABSTRACT

A resin composition contains a thermosetting resin (A) and an inorganic filler (B). The inorganic filler (B) includes: a first filler (B1); and a second filler (B2) of a nanometer scale having a smaller particle size than the first filler (B1). The first filler (B1) includes an anhydrous magnesium carbonate filler (b1) and an alumina filler (b2). The proportion of the first filler (B1) relative to a total solid content in the resin composition is equal to or greater than 50% by volume and equal to or less than 90% by volume. The proportion of the (Continued)

second filler (B2) relative to the total solid content in the resin composition is equal to or greater than 0.1% by volume and equal to or less than 2.0% by volume.

20 Claims, 5 Drawing Sheets

(51) Int. Cl.
    *C08K 3/22*     (2006.01)
    *C08K 9/06*     (2006.01)
    *C08L 63/00*     (2006.01)

(52) U.S. Cl.
    CPC .......... *C08L 63/00* (2013.01); *C08J 2363/00* (2013.01); *C08K 2003/2227* (2013.01); *C08K 2003/267* (2013.01); *C08K 2201/003* (2013.01); *C08K 2201/005* (2013.01); *C08K 2201/006* (2013.01)

(58) Field of Classification Search
    CPC ........ C08K 2201/003; C08K 2201/005; C08K 2201/006

USPC ...................................... 428/195.1
See application file for complete search history.

(56) References Cited

U.S. PATENT DOCUMENTS

2019/0270881 A1    9/2019  Shim et al.
2022/0372245 A1*  11/2022  Yamauchi ............... C08K 3/22

FOREIGN PATENT DOCUMENTS

| JP | 2012-211225 A | 11/2012 |
| JP | 2019-527759 A | 10/2019 |
| WO | WO 2010/016480 A1 | 2/2010 |

OTHER PUBLICATIONS

WO 2014119462 A1 English translation (Year: 2014).*
JP 2011016962 A English translation (Year: 2011).*
ISR for PCT/JP2020/039516, dated Dec. 28, 2020.

* cited by examiner though it has been incorporated by reference explicitly into the description above, the specification of US 11,814,502 B2 follows:

RESIN COMPOSITION, RESIN FILM, METAL FOIL WITH RESIN, PREPREG, METAL-CLAD LAMINATE, AND PRINTED WIRING BOARD

This is a U.S. National Phase of PCT/JP2020/039516, filed Oct. 21, 2020, which claims priority to JP 2019-194706, filed Oct. 25, 2019. The disclosure of JP 2019-194706 is expressly incorporated by reference herein in its entirety.

TECHNICAL FIELD

The present disclosure generally relates to a resin composition, a resin film, a sheet of metal foil with resin, a prepreg, a metal-clad laminate, and a printed wiring board. More particularly, the present disclosure relates to a resin composition containing a thermosetting resin, a resin film formed out of the resin composition, a sheet of metal foil with resin formed out of the resin composition, a prepreg formed out of the resin composition, a metal-clad laminate formed out of the resin composition, and a printed wiring board formed out of the resin composition.

BACKGROUND ART

Patent Literature 1 discloses a thermally conductive resin composition. The thermally conductive resin composition includes two or more inorganic fillers (including at least a first inorganic filler and a second inorganic filler), of which the combined content is equal to or greater than 60% by mass and equal to or less than 95% by mass. The first inorganic filler has a Mohs hardness of 4 or more and the second inorganic filler has a Mohs hardness of 3 or less. Also, the ratio of the first inorganic filler to the second inorganic filler is equal to or greater than 1:1 and equal to or less than 1:0.01.

CITATION LIST

Patent Literature

Patent Literature 1: JP 2012-087250 A

SUMMARY OF INVENTION

The problem to be overcome by the present disclosure is to provide a resin composition with excellent moldability, a resin film formed out of the resin composition, a sheet of metal foil with resin formed out of the resin composition, a prepreg formed out of the resin composition, a metal-clad laminate formed out of the resin composition, and a printed wiring board formed out of the resin composition.

A resin composition according to an aspect of the present disclosure contains a thermosetting resin (A) and an inorganic filler (B). The inorganic filler (B) includes: a first filler (B1); and a second filler (B2) of a nanometer scale having a smaller particle size than the first filler (B1). The first filler (B1) includes an anhydrous magnesium carbonate filler (b1) and an alumina filler (b2). Proportion of the first filler (B1) relative to a total solid content in the resin composition is equal to or greater than 50% by volume and equal to or less than 90% by volume. Proportion of the second filler (B2) relative to the total solid content in the resin composition is equal to or greater than 0.1% by volume and equal to or less than 2.0% by volume.

A resin film according to another aspect of the present disclosure contains the resin composition described above, a dried product of the resin composition, or a semi-cured product of the resin composition.

A sheet of metal foil with resin according to still another aspect of the present disclosure includes: a resin layer containing the resin composition described above, a dried product of the resin composition, or a semi-cured product of the resin composition; and a sheet of metal foil stacked on the resin layer.

A prepreg according to yet another aspect of the present disclosure includes: a base member; and the resin composition described above, a dried product of the resin composition, or a semi-cured product of the resin composition, any of which is impregnated into the base member.

A metal-clad laminate according to yet another of the present disclosure includes: an insulating layer containing a cured product of the resin composition described above; and a sheet of metal foil stacked on the insulating layer.

A printed wiring board according to yet another aspect of the present disclosure includes: an insulating layer containing a cured product of the resin composition described above; and a conductor layer stacked on the insulating layer.

DESCRIPTION OF EMBODIMENTS

Figure 1:
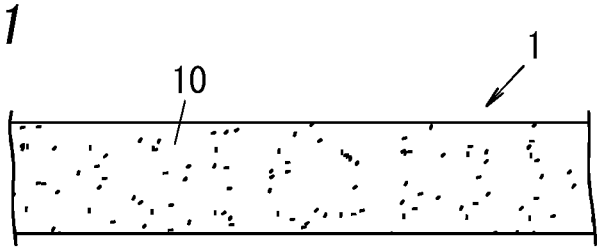
FIG. 1 is a schematic cross-sectional view of a resin film according to an exemplary embodiment of the present disclosure.
Figure 2:
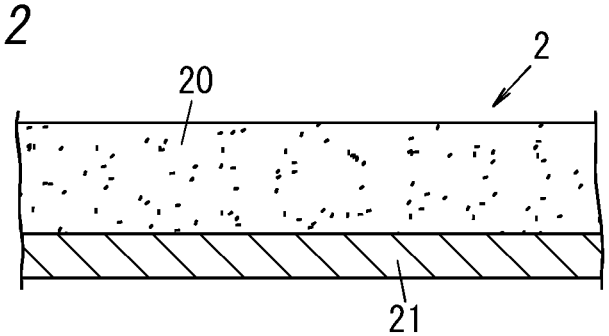
FIG. 2 is a schematic cross-sectional view of a sheet of metal foil with resin according to an exemplary embodiment of the present disclosure.
Figure 3:
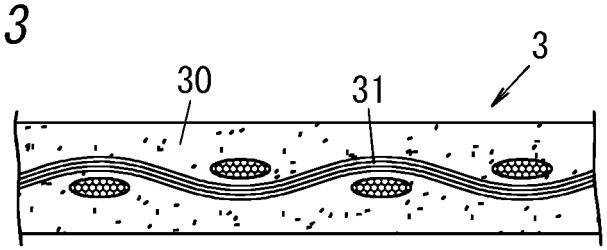
FIG. 3 is a schematic cross-sectional view of a prepreg according to an exemplary embodiment of the present disclosure.

In a resin composition for use to form a resin film, a sheet of metal foil with resin, a prepreg, a metal-clad laminate, and a printed wiring board, an inorganic filler is used to improve performance such as thermal conductivity and heat resistance. However, the inorganic filler tends to cause a decrease in moldability. Particularly if a resin composition containing an inorganic filler is molded to form an insulating layer and conductor wiring is embedded in the insulating layer, the resin composition preferably exhibits good flowability during its molding process to have the gaps of the conductor wiring sufficiently filled with the insulating layer. On the other hand, to prevent the resin composition from flowing out excessively during the molding process, it is preferred that the resin composition not have excessive flowability. To give moderate flowability to such a resin composition, the content of the inorganic filler may be adjusted, for example. However, it is difficult to impart moderate flowability to the resin composition simply by taking such a measure alone.

Thus, the present inventors carried out extensive research and development to provide a resin composition containing an inorganic filler and having excellent moldability, thus conceiving the concept of the present disclosure.

Next, an exemplary embodiment of the present disclosure will be described.

A resin composition according to an exemplary embodiment contains a thermosetting resin (A) and an inorganic filler (B). The inorganic filler (B) includes: a first filler (B1); and a second filler (B2) of a nanometer scale having a smaller particle size than the first filler (B1). The first filler (B1) includes an anhydrous magnesium carbonate filler (b1) and an alumina filler (b2). The proportion of the first filler (B1) relative to a total solid content in the resin composition is equal to or greater than 50% by volume and equal to or less than 90% by volume. The proportion of the second filler (B2) relative to the total solid content in the resin composition is equal to or greater than 0.1% by volume and equal to or less than 2.0% by volume. As used herein, the "solid content" refers to the components of the resin composition except volatile components thereof such as a solvent (i.e., components that will not be left in the cured product).

A resin film may be formed out of the resin composition. A sheet of metal foil with resin may also be formed out of the resin composition. A prepreg may also be formed out of the resin composition. A metal-clad laminate and a printed wiring board may also be formed out of each of the resin film, the sheet of metal foil with resin, and the prepreg.

According to this embodiment, the alumina filler (b2) has particularly high heat resistance, thus allowing a cured product of the resin composition to have high heat resistance. In addition, the anhydrous magnesium carbonate filler (b1) has no water of crystallization, and therefore, has good heat resistance and is less likely to inhibit the heat resistance of the cured product. Furthermore, the anhydrous magnesium carbonate filler (b1) has a lower hardness than the alumina filler (b2). Thus, when a cured product of the resin composition is machined with a drill, the anhydrous magnesium carbonate filler (b1) makes the drill less wearable. This makes it easier to impart high thermal resistance and drillability to the cured product of the resin composition.

Furthermore, the second filler (B2) allows the resin composition to exhibit moderate flowability during the molding process. This makes it easier, particularly when an insulating layer is formed by molding the resin composition and conductor wiring is embedded in the insulating layer, to sufficiently fill the gaps of the conductor wiring with the insulating layer. Besides, this also reduces excessive flow of the resin composition during the molding process and may reduce, for example, outflow of the resin composition from the insulating layer, thus reducing the chances of the insulating layer being molded in a non-intended shape.

Thus, this embodiment provides a resin composition containing an inorganic filler and having excellent moldability.

This embodiment will be described in further detail.

First, respective components of the resin composition will be described.

The thermosetting resin (A) contains, for example, at least one of a monomer or a prepolymer. The prepolymer may contain oligomers. The type of the polymerization reaction of the thermosetting resin (A) is not limited to any particular one. Specific examples of the polymerization reaction include chain polymerization and step-growth polymerization. A typical example of the chain polymerization is radical polymerization. A typical example of the step-growth polymerization is polyaddition.

The thermosetting resin (A) contains at least one selected from the group consisting of, for example, epoxy resins (a), phenoxy resins, polyimide resins, polyester resins, triazine resins, maleimide resins, polyphenylene ether resins, and polyphenylene ether resins having a functional group including a C—C unsaturated bond in one molecule, and derivatives of these resins.

The thermosetting resin (A) preferably contains at least one of an epoxy resin (a) or a phenoxy resin. The epoxy resin (a) preferably includes a resin having two or more epoxy rings (oxirane rings) in one molecule. The epoxy resin (a) may be liquid or solid, whichever is appropriate.

The epoxy resin (a) includes at least one selected from the group consisting of: bisphenol epoxy resins; novolac epoxy resins; arylalkylene epoxy resins; naphthalene skeleton modified epoxy resins; trifunctional epoxy resins; phenoxy resins; triphenylmethane epoxy resins; anthracene epoxy resins; dicyclopentadiene epoxy resins; norbornene epoxy resins; fluorene epoxy resins; flame retardant epoxy resins obtained by halogenating any of the above epoxy resins; epoxy resins modified with a phosphorus compound; preliminary reaction products between an epoxy resin and a polyphenylene ether resin; and preliminary reaction products between an epoxy resin and an acid anhydride; and derivatives of these resins.

The bisphenol epoxy resin includes at least one selected from the group consisting of: bisphenol A epoxy resins; bisphenol F epoxy resins; and bisphenol S epoxy resins; and derivatives of these resins.

The novolac epoxy resin includes at least one selected from the group consisting of: phenol novolac epoxy resins; and cresol novolac epoxy resins; and derivatives of these resins.

The arylalkylene epoxy resin includes at least one selected from the group consisting of: biphenyl epoxy resins; xylylene epoxy resins; phenol aralkyl epoxy resins; biphenyl aralkyl epoxy resins; biphenyl novolac epoxy resins; biphenyl dimethylene epoxy resins; trisphenol methane novolac epoxy resins; and tetramethylbiphenyl epoxy resins; and derivatives of these resins.

The naphthalene skeleton modified epoxy resin includes at least one selected from the group consisting of: naphthalene epoxy resins; naphthalene skeleton modified cresol novolac epoxy resins; naphthalene diol aralkyl epoxy resins; naphthol aralkyl epoxy resins; methoxy naphthalene modified cresol novolac epoxy resins; and methoxy naphthalene dimethylene epoxy resins; and derivatives of these resins.

The phenoxy resin is a resin obtained by polymerizing a bisphenol A epoxy resin in a normal (or straight) chain form.

The thermosetting resin (A) preferably includes a liquid resin (e.g., an epoxy resin in liquid state at room temperature).

If the thermosetting resin (A) contains the epoxy resin (a), then the epoxy resin (a) preferably includes an epoxy resin (a1) having a softening point equal to or lower than 75° C. The proportion of the epoxy resin (a1) relative to the epoxy resin (a) is preferably equal to or greater than 30% by mass. This allows, when a sheet-shaped member (sheet member) such as a resin film or a prepreg is formed out of the resin composition, the sheet member to have good flexibility and makes the sheet member less breakable even when the sheet member is bent. The proportion of the epoxy resin (a1) is preferably equal to or greater than 30% by mass, and more preferably equal to or greater than 50% by mass. The proportion of the epoxy resin (a1) may even be 100% by mass. Also, the softening point of the epoxy resin (a1) is more preferably equal to or lower than 70° C., and even more preferably equal to or lower than 65° C. The softening point may be measured by the ring-and-ball method using a softening point measuring device in compliance with JISK7231 (general rule of test method for epoxy resin and curing agent).

If the thermosetting resin (A) contains at least one of an epoxy resin (a) or a phenoxy resin, then the resin composition preferably further contains a curing agent. The curing agent contains at least one selected from the group consisting of: dicyandiamide; a phenolic resin; acid anhydride; and cyanate ester. Among other things, the curing agent preferably contains dicyandiamide. This increases the chances of the resin film 1 having good flexibility. The phenolic resin may include a phosphorus-containing phenolic resin. This may improve the flame retardance of the resin composition.

The resin composition may further contain a catalyst. The catalyst may promote the reaction between the thermosetting resin (A) and the curing agent. The catalyst contains at least one selected from the group consisting of organic acid metal salts (such as metal soaps), tertiary amines, and imidazoles. The organic acid metal salt contains at least one selected from the group consisting of: metal salts such as Zn, Cu, and Fe of organic acids such as octanoic acid, stearic acid, acetylacetonate, naphthenic acid, salicylic acid, and octylic acid. An example of a metal salt of an organic acid may be zinc ocrylate (bis(2-ethylhexanoic acid) zinc). The tertiary amine contains at least one selected from the group consisting of triethylamine, triethanolamine, and other amines. The imidazole includes at least one selected from the group consisting of 2-ethyl-4-methylimidazole, 4-methylimidazole, and other imidazoles.

As described above, the resin composition contains an inorganic filler (B). The inorganic filler (B) includes: a first filler (B1); and a second filler (B2) of a nanometer scale having a smaller particle size than the first filler (B1). Note that the particle size of the first filler (B1) is a median diameter obtained by laser diffraction and scattering method and the particle size of the second filler (B2) is a value calculated based on the BET specific surface area of the second filler (B2).

As described above, the proportion of the first filler (B1) relative to the total solid content is equal to or greater than 50% by volume and equal to or less than 90% by volume, and the proportion of the second filler (B2) relative to the total solid content is equal to or greater than 0.1% by volume and equal to or less than 2.0% by volume. Thus, the resin composition tends to have good moldability. That is to say, setting the proportion of the first filler (B1) at 50% by volume or more may improve the thermal conductivity and heat resistance of the resin composition. Setting the proportion of the first filler (B1) at 90% by volume or less may reduce the chances of the insulating layer being molded in a non-intended shape. In addition, setting the proportion of the second filler (B2) at 0.1% by volume or more may impart moderate flowability to the resin composition. Setting the proportion of the second filler (B2) at 2.0% by volume or less may reduce the chances of the insulating layer being molded in a non-intended shape.

The proportion of the first filler (B1) is more preferably equal to or greater than 60% by volume and even more preferably equal to or greater than 65% by volume. Also, the proportion of the first filler (B1) is more preferably equal to or less than 87% by volume and even more preferably equal to or less than 85% by volume. The proportion of the second filler (B2) is more preferably equal to or greater than 0.2% by volume and even more preferably equal to or greater than 0.3% by volume. Also, the proportion of the second filler (B2) is more preferably equal to or less than 1.7% by volume and even more preferably equal to or less than 1.5% by volume.

Also, the proportion of the second filler (B2) relative to the solid content except the inorganic filler (B) is preferably equal to or greater than 1.0% by volume and equal to or less than 8.0% by volume. This makes even easier to fill the gaps of the conductor wiring with the insulating layer and further reduces the chances of the resin composition flowing out of the insulating layer. That is to say, setting the proportion of the second filler (B2) at 1.0% by volume or more may impart moderate flowability to the resin composition and setting the proportion of the second filler (B2) at 8.0% by volume or less may reduce the chances of the insulating layer being molded in a non-intended shape. The proportion of the second filler (B2) is more preferably equal to or greater than 1.1% by volume and even more preferably equal to or greater than 1.2% by volume. The proportion of the second filler (B2) is more preferably equal to or less than 7.0% by volume and even more preferably equal to or less than 5.0% by volume.

The first filler (B1) includes, for example, an anhydrous magnesium carbonate filler (b1) and an alumina filler (b2). In this case, the anhydrous magnesium carbonate filler (b1) has no water of crystallization, and therefore, has high heat resistance. The alumina filler (b2) has even higher heat resistance than the anhydrous magnesium carbonate filler (b1). Thus, if the first filler (B1) includes the anhydrous magnesium carbonate filler (b1) and the alumina filler (b2), then heat resistance may be imparted to the resin composition.

The particles of the anhydrous magnesium carbonate filler (b1) may have a polyhedral shape, for example, and preferably have a rounded shape. Anhydrous magnesium carbonate has no water of crystallization, and therefore, has superior thermal stability to a dihydrate, a trihydrate, or a pentahydrate compound of anhydrous magnesium carbonate. Therefore, if the first filler (B1) includes the anhydrous magnesium carbonate filler (b1), the heat resistance of the resin composition may be improved more easily. To further improve the heat resistance of the resin composition, the first filler (B1) preferably contains no hydrates of magnesium carbonate or the hydrates of magnesium carbonate contained in the first filler (B1) are preferably very small amounts of inevitably contained impurities.

The anhydrous magnesium carbonate filler (b1) has relatively high thermal conductivity for an inorganic substance. Thus, the anhydrous magnesium carbonate filler (b1) may improve the thermal conductivity of the resin composition.

The anhydrous magnesium carbonate filler (b1) is a crystal with a relatively low Mohs hardness, which would reduce the wear of a drill when an insulating layer formed out of the resin composition is machined with the drill. That is to say, the anhydrous magnesium carbonate filler (b1) makes it easier to improve the drillability of the insulating layer.

The anhydrous magnesium carbonate filler (b1) suitably has a median diameter (obtained by laser diffraction and scattering method) equal to or greater than 8 μm and equal to or less than 30 μm. Setting the median diameter at 8 μm or more reduces the area of contact between the anhydrous magnesium carbonate filler (b1) and the thermosetting resin (A), thus reducing the chances of causing a decrease in the thermal conductivity of a cured product of the resin composition. Setting the median diameter at 30 μm or less may reduce the chances of causing a decline in the electrical insulation properties of a cured product of the resin composition. The anhydrous magnesium carbonate filler (b1) more preferably has a median diameter equal to or greater than 8 μm and equal to or less than 25 μm and even more preferably has a median diameter equal to or greater than 8 μm and equal to or less than 20 μm.

The alumina filler (b2) has higher thermal conductivity and higher heat resistance than the anhydrous magnesium carbonate filler (b1), thus improving the thermal conductivity and heat resistance of the cured product of the resin composition.

The shape of the particles that form the alumina filler (b2) is preferably a rounded shape. As used herein, the "rounded shape" refers to a shape with no pointed protruding portions. The rounded shape includes a spherical shape and a spheroid shape, for example, but does not include a plate shape, a polyhedron shape, a rectangular parallelepiped shape, a rod shape, a needle shape, or a scale shape. Making the particles that form the alumina filler (b2) rounded improves the flowability of the resin composition more easily during the molding process, thus making it easier to improve the moldability of the resin composition.

The alumina filler (b2) has a relatively high Mohs hardness, and therefore, preferably has as small a median diameter as possible. Specifically, the alumina filler (b2) preferably has a median diameter equal to or greater than 0.1 μm and equal to or less than 5 μm. This may reduce the wear of a drill when the cured product of the resin composition is machined with the drill. The alumina filler (b2) more preferably has a median diameter equal to or greater than 0.1 μm and equal to or less than 4.0 μm and even more preferably has a median diameter equal to or greater than 0.1 μm and equal to or less than 3.0 μm.

The proportion of the anhydrous magnesium carbonate filler (b1) relative to the inorganic filler (B) is preferably equal to or greater than 25% by volume and equal to or less than 75% by volume. If the proportion of the anhydrous magnesium carbonate filler (b1) is less than 35% by volume, then the proportion of the alumina filler (b2) increases relatively. The alumina filler (b2) has high hardness. Thus, as the proportion of the alumina filler (b2) increases, the drillability tends to decrease more easily. If the proportion of the anhydrous magnesium carbonate filler (b1) is greater than 65% by volume, then the proportion of the alumina filler (b2) decreases relatively. In a situation where the (particles of the) anhydrous magnesium carbonate filler (b1) has a non-rounded shape (such as a polyhedral shape), as the content of the anhydrous magnesium carbonate filler (b1) increases, the moldability of the resin composition is more likely to decrease, even if the (particles of the) alumina filler (b2) has a rounded shape. The proportion of the anhydrous magnesium carbonate filler (b1) is more preferably equal to or greater than 30% by volume and equal to or less than 70% by volume, and is even more preferably equal to or greater than 35% by volume and equal to or less than 65% by volume.

Also, the proportion of the alumina filler (b2) relative to the inorganic filler (B) is preferably equal to or greater than 25% by volume and equal to or less than 75% by volume, is more preferably equal to or greater than 30% by volume and equal to or less than 70% by volume, and is even more preferably equal to or greater than 35% by volume and equal to or less than 65% by volume.

The median diameter of the anhydrous magnesium carbonate filler (b1) is preferably larger than the median diameter of the alumina filler (b2). This makes it easier to densely fill the resin composition and its cured product with the first filler (B1). This would place the particles that form the anhydrous magnesium carbonate filler (b1) and the alumina filler (b2) in proximity to each other, thus making it easier to form a heat conduction path and thereby improve the thermal conductivity of the resin composition and its cured product. Among other things, it is particularly recommended that the median diameter of the anhydrous magnesium carbonate filler (b1) be equal to or greater than 8 μm and equal to or less than 30 μm and that the median diameter of the alumina filler (b2) be 5d μm or less. This would further improve their thermal conductivity.

Optionally, the first filler (B1) may contain additional components other than the anhydrous magnesium carbonate filler (b1) and the alumina filler (b2). For example, the first filler (B1) may further include an inorganic filler (b3) on which a molybdenum compound is supported. Each particle of the inorganic filler (b3) may have, for example, a core of an inorganic substance and a molybdenum compound supported on the core. For example, in each particle of the inorganic filler (b3), the surface of the core may be covered with the molybdenum compound either partially or entirely.

The inorganic substance contained in the inorganic filler (b3) is not limited to any particular one. The inorganic substance contains at least one selected from the group consisting of carbonates, metal oxides, silicates, metal hydroxides, and other compounds. Examples of carbonates include calcium carbonate. Examples of metal oxides include zinc oxide. Examples of silicates include talc. Examples of metal hydroxides include magnesium hydroxide.

The molybdenum compound is not limited to any particular one. The molybdenum compound contains at least one selected from the group consisting of: zinc molybdate; calcium molybdate; magnesium molybdate; molybdenum trioxide; ammonium molybdate; barium molybdate; sodium molybdate; potassium molybdate; phosphomolybdic acid; ammonium phosphomolybdate; sodium phosphomolybdate; silico molybdic acid; molybdenum boride; molybdenum disilicide; molybdenum nitride; and molybdenum carbide. Among other things, the molybdenum compound preferably contains at least one selected from the group consisting of zinc molybdate, calcium molybdate, and magnesium molybdate from the viewpoints of chemical stability, moisture resistance, and insulation properties.

If the first filler (B1) includes the inorganic filler (b3), the drillability of the cured product of the resin composition is improvable more easily, because the molybdenum compound is supported on the inorganic core in the inorganic filler (b3). Among other things, if the core in the inorganic filler (b3) is talc, the drillability is even easier to improve.

If the first filler (B1) further includes the inorganic filler (b3), then the proportion of the inorganic filler (b3) is preferably 10% by volume or less relative to the inorganic filler (B). The heat resistance of the inorganic filler (b3) may be lower than that of the anhydrous magnesium carbonate filler (b1) or that of the alumina filler (b2). Thus, setting the proportion of the inorganic filler (b3) at 10% by volume or less allows a decline in the heat resistance of the resin composition to be curbed.

The first filler (B1) is preferably subjected to surface treatment with a coupling agent. This improves the degree of adhesion between the thermosetting resin (A) and the first filler (B1). The method of the surface treatment may be wet treatment or dry treatment, whichever is appropriate. At least one of the anhydrous magnesium carbonate filler (b1) or the alumina filler (b2) is preferably subjected to surface treatment with the coupling agent.

Any coupling agent may be used without limitation as long as the coupling agent includes, in one molecule, a reactive group to chemically bond to an inorganic material and a reactive group to chemically bond to an organic material. Specific examples of the reactive group to chemically bond to an inorganic material include an ethoxy group and a methoxy group. Specific examples of the reactive group to chemically bond to an organic material include an epoxy group, an amino group, an isocyanate group, a hydroxy group, a phenolic hydroxy group, and an acid anhydride group.

The coupling agent includes a silane coupling agent. The silane coupling agent may include, for example, epoxy silane, amino silane, isocyanate silane, and acid anhydride silane. Specific examples of epoxy silanes include 3-glycidoxypropyltrimethoxy silane and 3-glycidoxypropyltriethoxy silane. Specific examples of amino silane include 3-aminopropyltriethoxy silane. Specific examples of isocyanate silane include 3-isocyanatepropyltriethoxy silane.

On the other hand, the particle size of the second filler (B2) is nanometer scale as described above and is smaller than the particle size of the first filler (B1). That is why the second filler (B2) has a larger specific surface area than the first filler (B1), thus enabling imparting moderate flowability to the resin composition. The particle size of the second filler (B2) is preferably less than 100 nm and more preferably equal to or less than 50 nm. This allows an even smaller amount of the second filler (B2) to impart moderate flowability to the resin composition. Also, the second filler (B2) preferably has a specific surface area (measured by the BET method) equal to or greater than 100 m$^2$/g and equal to or less than 400 m$^2$/g. Setting the specific surface area at 100 m$^2$/g or more enables imparting moderate flowability to the resin composition. Setting the specific surface area at 400 m$^2$/g or less may reduce the chances of the insulating layer being molded in a non-intended shape. The specific surface area is more preferably equal to or greater than 130 m$^2$/g and equal to or less than 350 m$^2$/g and is even more preferably equal to or greater than 150 m$^2$/g and equal to or less than 300 m$^2$/g.

The material for the second filler (B2) is not limited to any particular one. The second filler (B2) preferably contains at least one of silica or alumina. The silica includes at least one of a dry silica such as a fumed silica or a wet silica manufactured by a wet method such as a sol-gel process. The alumina includes a dry alumina such as a fumed alumina.

The second filler (B2) is preferably subjected to hydrophobization treatment. Particularly, the second filler (B2) is preferably treated with at least one surface treatment agent selected from the group consisting of alkyl silane, silicone oil, epoxy silane, amino silane, isocyanate silane, and acid anhydride silane. This allows the second filler (B2), having a small particle size, to sufficiently disperse in the resin composition, and therefore, is less likely to inhibit the flowability of the resin composition.

The resin composition may further contain additives other than the components described above. The additives include at least one selected from the group consisting of flame retardants, coupling agents, and dispersants. The flame retardant may be an organic flame retardant or an inorganic flame retardant, whichever is appropriate. The organic flame retardant contains at least one selected from the group consisting of halogen compounds, phosphorus compounds, and other compounds. The phosphorus compound contains at least one selected from the group consisting of: a phosphate ester flame retardant; a phosphazene flame retardant; a bisdiphenylphosphine oxide flame retardant; and a phosphinate flame retardant. The phosphate ester flame retardant contains, for example, a condensed phosphate ester of dixylenyl phosphate. The phosphazene flame retardant contains, for example, phenoxyphosphazene. The bisdiphenylphosphine oxide flame retardant contains, for example, xylylene bisdiphenylphosphine oxide. The phosphinate flame retardant contains, for example, a phosphinic acid metal salt of a dialkylphosphinic acid aluminum salt. The inorganic flame retardant contains, for example, metal hydroxides.

Any coupling agent may be used without limitation as long as the coupling agent includes, in one molecule, a reactive group to chemically bond to an inorganic material and a reactive group to chemically bond to an organic material. Specific examples of the reactive group to chemically bond to an inorganic material include an ethoxy group and a methoxy group. Specific examples of the reactive group to chemically bond to an organic material include an epoxy group, an amino group, an isocyanate group, a hydroxy group, a phenolic hydroxy group, and an acid anhydride group. The coupling agent includes a silane coupling agent. The silane coupling agent may include, for example, epoxy silane, amino silane, isocyanate silane, and acid anhydride silane. Specific examples of epoxy silanes include 3-glycidoxypropyltrimethoxy silane and 3-glycidoxypropyltriethoxy silane. Specific examples of amino silane include 3-aminopropyltriethoxy silane. Specific examples of isocyanate silane include 3-isocyanatepropyltriethoxy silane. Further adding the coupling agent to the resin composition increases the degree of adhesion between the organic material and the inorganic material.

The dispersant is a type of a surfactant and is not limited to any particular one. Further adding a dispersant to the resin composition allows the first filler (B1) and the second filler (B2) to be dispersed more uniformly.

The resin composition may be prepared by mixing the above-described components together, for example. If the thermosetting resin (A) is in solid state at an ordinary temperature, then a solvent is suitably further added to the resin composition. Any solvent may be used without limitation, as long as the solvent is able to dissolve at least the thermosetting resin (A). For example, methyl ethyl ketone may be used as the solvent. Nevertheless, if the thermosetting resin (A) is in liquid state at an ordinary temperature, then there is no need to further add any solvent to the resin composition.

A resin film 1 according to this embodiment includes the resin composition, a dried product of the resin composition, or a semi-cured product of the resin composition. The resin film 1 may be formed by applying the resin composition onto a supporting film and then heating the resin composition. The resin film 1 is used with its supporting film peeled off. The supporting film may be a polyethylene terephthalate (PET) film, for example.

An insulating layer 40 of a metal-clad laminate 4 and an insulating layer 50 of a printed wiring board 5, for example, may be formed by curing the resin film 1.

The resin film 1 may, but does not have to, have a thickness equal to or greater than 50 μm and equal to or less than 200 μm, for example.

A sheet of metal foil 2 with resin according to this embodiment includes a resin layer 20 and a sheet of metal foil 21 stacked on the resin layer 20. The resin layer 20 includes the resin composition, a dried product of the resin composition, or a semi-cured product of the resin composition.

The sheet of metal foil 2 with resin may be manufactured by applying the resin composition onto the sheet of metal foil 21 and then heating the resin composition to form the resin layer 20.

The insulating layer 40 of the metal-clad laminate 4 and the insulating layer 50 of the printed wiring board 5, for example, may be formed by curing the resin layer 20 of the sheet of metal foil 2 with resin.

A prepreg 3 according to this embodiment includes: a base member; and the resin composition, a dried product of the resin composition, or a semi-cured product of the resin composition, any of which is impregnated into the base member.

The prepreg 3 may be formed by, for example, impregnating the base member 31 with the resin composition and then heating the resin composition. The base member 31 may be a piece of glass cloth, for example.

The insulating layer 40 of the metal-clad laminate 4 and the insulating layer 50 of the printed wiring board 5, for example, may be formed by curing the prepreg 3.

Figure 4:
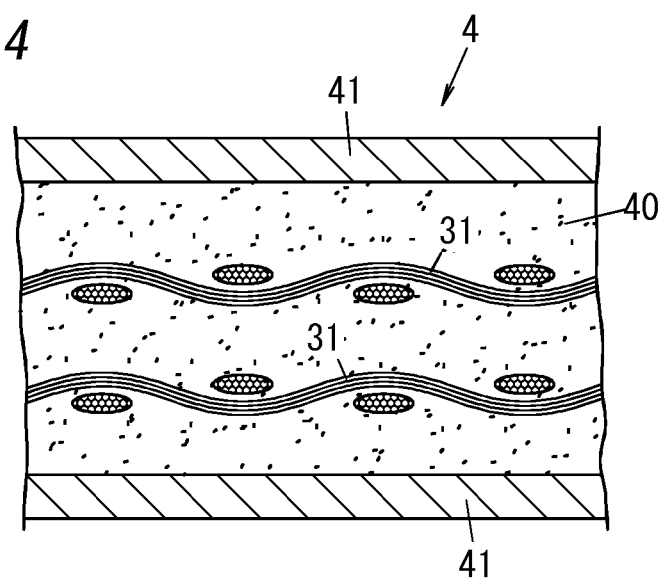
FIG. 4 is a schematic cross-sectional view of a metal-clad laminate according to an exemplary embodiment of the present disclosure.

A metal-clad laminate 4 according to this embodiment includes an insulating layer 40 and sheets of metal foil 41 as shown in FIG. 4. The insulating layer 40 includes a cured product of the resin composition. The sheets of metal foil 41 are bonded to the insulating layer 40.

The sheets of metal foil 41 may be sheets of copper foil, for example. The thickness of the sheets of metal foil 41 is not limited to any particular value but is preferably equal to or greater than 12 μm and equal to or less than 420 μm, and is more preferably equal to or greater than 18 μm and equal to or less than 210 μm. The ten-point average roughness Rzjis of the sheets of metal foil 41 is not limited to any particular value, either, but is preferably 3 μm or more, and more preferably 5 μm or more. Setting the ten-point average roughness Rzjis of the sheets of metal foil 41 at 3 μm or more increases the degree of adhesion between the insulating layer 40 and the sheets of metal foil 41 more significantly.

The metal-clad laminate 4 may be formed by, for example, laying at least one sheet of metal foil 41 on top of either or both surfaces of a single prepreg 3 or a multilayer stack of two or more prepregs 3 and subjecting the multilayer stack to hot pressing, for example. Before the sheets of metal foil 41 are laid on top of the prepreg 3, the surfaces of the sheets of metal foil 41 (at least the surfaces to be laid on the prepreg 3) are treated with a coupling agent. Subjecting the sheets of metal foil 41 to surface treatment with a coupling agent in this manner allows the coupling agent to couple the organic material in the prepreg 3 to the sheets of metal foil 41, thus further increasing the degree of adhesion between the insulating layer 40 and the sheets of metal foil 41. Any of the exemplary coupling agents described above may be used as the coupling agent. The condition for hot pressing is not limited to any particular one. FIG. 4 illustrates a metal-clad laminate 4 in which two base members 31 are buried in the insulating layer 40. In this embodiment, the resin composition has moderate flowability. This reduces the chances of the resin composition, a dried product of the resin composition, or a semi-cured product of the resin composition flowing out of the prepreg formed out of the resin composition while the multilayer stack is being hot pressed. This reduces the chances of causing a molding failure.

Figure 5A:
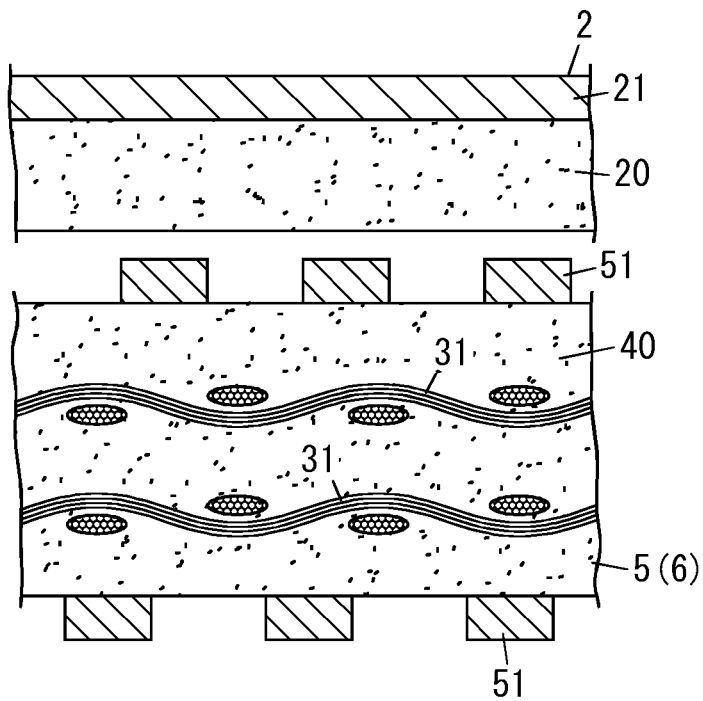
FIG. 5A is a schematic cross-sectional view of a printed wiring board according to an exemplary embodiment of the present disclosure.
Figure 5B:
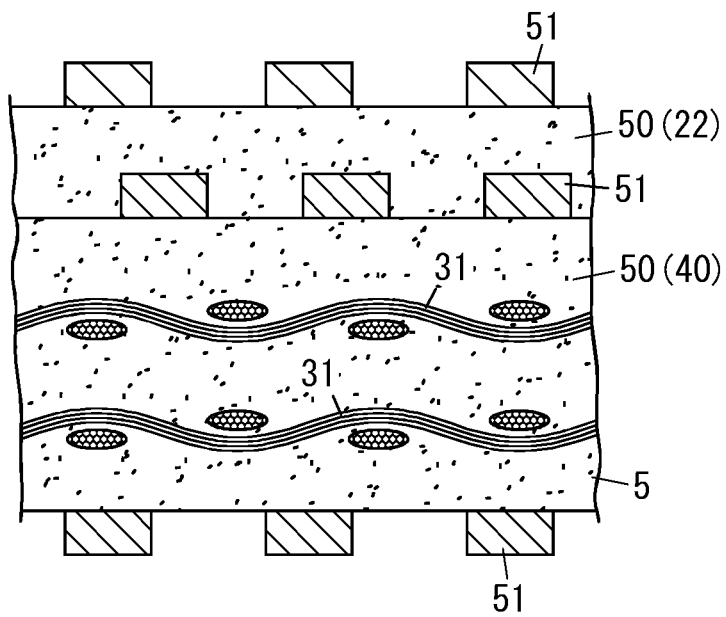
FIG. 5B is a schematic cross-sectional view of a multi-layer printed wiring board according to an exemplary embodiment of the present disclosure.

A printed wiring board 5 according to this embodiment includes an insulating layer 50 and conductor layers 51 as shown in FIGS. 5A and 5B. The insulating layer 50 includes a cured product of the resin composition. The conductor layers 51 are bonded to the insulating layer 50. As used herein, the conductor layers 51 refer to layers with electrical conductivity such as a signal layer, a power supply layer, and a ground layer. Each of the conductor layers 51 may be conductor wiring or a sheet of metal foil with no patterns. Note that the printed wiring board 5 is a concept encompassing a multilayer printed wiring board with three or more conductor layers 51. Specifically, FIG. 5B illustrates a multilayer printed wiring board 5 including three conductor layers 51.

The printed wiring board 5 may be formed by, for example, applying a subtractive method to the metal-clad laminate 4 as a material. Optionally, the printed wiring boards 5 may be laid one on top of another by a buildup method.

Specifically, the printed wiring board 5 shown in FIG. 5A may be manufactured by forming, by subtractive method, for example, conductor wirings serving as the conductor layers 51 out of the sheet of metal foil 41 of the metal-clad laminate 4. Optionally, a hole may be opened through the metal-clad laminate 4 by machining the metal-clad laminate 4 with a drill, and a via metal may be formed by plating the inner surface of the hole while the conductor wiring is being formed. That is to say, a printed wiring board 5 having such a via metal may be formed. This makes the drill less wearable according to this embodiment.

Alternatively, the printed wiring board 5 may also be manufactured in the following manner. First, a core member 6 is formed by forming, by the subtractive method, for example, conductor wiring serving as the conductor layer 51 out of the sheet of metal foil 41 of the metal-clad laminate 4. That is to say, the printed wiring board 5 shown in FIG. 5A is used as the core member 6. Next, the core member 6 and the sheet of metal foil 2 with resin are stacked one on top of the other such that the resin layer 20 of the sheet of metal foil 2 with resin is laid on top of one conductor wiring of the core member 6. In this state, the core member 6 and the sheet of metal foil 2 with resin are subjected to hot pressing. In this embodiment, the resin composition has moderate flowability. This reduces the chances of the resin composition, a dried product of the resin composition, or a semi-cured product of the resin composition flowing, at this time, out of the resin layer 20 formed out of the resin composition. In addition, this facilitates the resin layer 20 flowing into the gaps of the conductor wiring. The insulating layer 22 is formed by curing this resin layer 20. At this time, the gaps of the conductor wiring are likely to be sufficiently filled with the insulating layer 22. Subsequently, conductor wiring serving as the conductor layer 51 may be formed by subtractive method, for example, out of the sheet of metal foil 21 derived from the sheet of metal foil 2 with resin. In this manner, a multilayer printed wiring board 5 may be formed as shown in FIG. 5B. This multilayer printed wiring board 5 includes, as the insulating layers 50, an insulating layer 40 derived from the core member 6 and another insulating layer 22 formed out of the resin layer 20 of the sheet of metal foil 2 with resin. Optionally, a printed wiring board 5 with an even larger number of layers may also be manufactured by using this multilayer printed wiring board 5 as a core member and using the sheet of metal foil 2 with resin in the same way as described above. A hole may be opened through this printed wiring board 5 by machining the printed wiring board 5 with a drill, and a via metal may be formed by plating the inner surface of the hole. This makes the drill less wearable according to this embodiment.

Still alternatively, the printed wiring board 5 may also be manufactured in the following manner. The core member 6, the resin film 1, and the sheet of metal foil are stacked one on top of another such that the resin film 1 is laid on top of the conductor wiring of the core member 6 and the sheet of metal foil is laid on top of the resin film 1. In this state, the core member 6, the resin film 1, and the sheet of metal foil are subjected to hot pressing. In this embodiment, the resin composition has moderate flowability. This reduces the chances of the resin composition, a dried product of the resin composition, or a semi-cured product of the resin composition flowing, at this time, out of the resin film 1 formed out of the resin composition. In addition, this facilitates the resin film 1 flowing into the gaps of the conductor wiring. The insulating layer is formed by curing this resin film 1. At this time, the gaps of the conductor wiring are likely to be sufficiently filled with the insulating layer. Subsequently, conductor wiring may be formed by subtractive method, for example, out of the sheet of metal foil. In this manner, a multilayer printed wiring board 5 may be formed. Optionally, a printed wiring board 5 with an even larger number of layers may also be manufactured by using this multilayer printed wiring board 5 as a core member and using the sheet of metal foil with resin in the same way as described above. A hole may be opened through this printed wiring board 5 by machining the printed wiring board 5 with a drill, and a via metal may be formed by plating the inner surface of the hole. This makes the drill less wearable according to this embodiment.

In the foregoing description, the core member 6 is formed out of the metal-clad laminate 4 including the insulating layer 40 that has been formed out of the resin composition according to this embodiment, and then the printed wiring board 5 is formed out of the core member 6. However, the core member 6 does not have to be formed as described above. That is to say, the insulating layer 40 of the core member 6 does not have to be formed out of the resin composition according to this embodiment.

EXAMPLES

Next, specific examples of this embodiment will be presented. Note that these are only examples of this embodiment and should not be construed as limiting.

1. Materials

The following materials were provided:

Epoxy resin 1: naphthalene liquid epoxy resin; product number HP-4032D manufactured by DIC Corporation; having a specific gravity of 1.20; liquid state at room temperature;

Epoxy resin 2: naphthalene epoxy resin; product number HP-4710 manufactured by DIC Corporation; having a specific gravity of 1.20 and a softening point of 95° C.;

Epoxy resin 3: bisphenol A epoxy resin; product name EPICLON 850-S manufactured by DIC Corporation; having a specific gravity of 1.15; liquid state at room temperature;

Epoxy resin 4: trifunctional epoxy resin; product number VG-3101 manufactured by Printec Inc.; having a specific gravity of 1.18 and a softening point of 61° C.;

Phenoxy resin: product number YP-50 manufactured by Nippon Steel Chemical & Materials Co., Ltd.;

Polyphenylene ether resin: product number SA-90 manufactured by SABIC Japan llc;

Phenolic resin 1: phosphorus-containing phenolic resin; product number XZ92741 manufactured by Dow Chemical Company;

Phenolic resin 2: product number MEH-7600-4H manufactured by Meiwa Plastic Industries, Ltd.;

Curing agent: dicyandiamide;

Catalyst: 2-ethyl-4-methylimidazole;

Flame retardant: phosphate ester; product number PX-200 manufactured by Daihachi Chemical Industry Co., Ltd.; having a specific gravity of 1.26;

Coupling agent: silane coupling agent; product number KBE-403 manufactured by Shin-Etsu Chemical Co., Ltd.; having a specific gravity of 1.00;

Dispersant: wet dispersant; product number BYK-W903 manufactured by BYK Japan KK; having a specific gravity of 1.00;

Leveling agent: product number F-556 manufactured by DIC Corporation; having a specific gravity of 1.00;

Anhydrous magnesium carbonate filler: synthetic magnesite; product number MS-PS manufactured by Konoshima Chemical Co., Ltd.; having a median diameter of 12 μm and a specific gravity of 3.04;

Alumina filler: spherical alumina; product number AO-502 manufactured by Admatechs; having a median diameter of 0.25 μm and a specific gravity of 3.96;

Talc: calcium carbonate on which calcium molybdate is supported; product number KG-501 manufactured by Huber Inc.; having a median diameter of 4.5 μm and a specific gravity of 3.00;

Dry silica 1: fumed silica; product name AEROSIL R972 manufactured by Evonik Japan Co., Ltd.; having a BET specific surface area of 110 $m^2/g$ and a specific gravity of 2.20;

Dry silica 2: fumed silica; product name AEROSIL R974 manufactured by Evonik Japan Co., Ltd.; having a BET specific surface area of 170 $m^2/g$ and a specific gravity of 2.20;

Dry silica 3: fumed silica; product name AEROSIL R976S manufactured by Evonik Japan Co., Ltd.; having a BET specific surface area of 240 $m^2/g$ and a specific gravity of 2.20;

Dry silica 4: fumed silica; product name AEROSIL RX200R manufactured by Evonik Japan Co., Ltd.; having a BET specific surface area of 140 $m^2/g$ and a specific gravity of 2.20;

Dry silica 5: fumed silica; product name AEROSIL RX300 manufactured by Evonik Japan Co., Ltd.; having a BET specific surface area of 210 $m^2/g$ and a specific gravity of 2.20;

Dry silica 6: fumed silica; product name AEROSIL R805 manufactured by Evonik Japan Co., Ltd.; having a BET specific surface area of 150 $m^2/g$ and a specific gravity of 2.20;

Dry alumina: fumed alumina; product name AEROXIDE Alu C805 manufactured by Evonik Japan Co., Ltd.; having a BET specific surface area of 90 $m^2/g$ and a specific gravity of 3.96;

Wet silica 1: methyl ethyl ketone dispersed silica sol; product number MEK-EC-2130Y manufactured by Nissan Chemical Corporation; having a BET specific surface area of 230 $m^2/g$ and a specific gravity of 2.20; and Wet silica 2: methyl ethyl ketone dispersed silica sol; product number MEK-EC-2430Z manufactured by Nissan Chemical Corporation; having a BET specific surface area of 230 $m^2/g$ and a specific gravity of 2.20.

Each of the dry silica, the dry alumina, and the wet silica is surface-treated with at least one surface treatment agent selected from the group consisting of alkyl silane, silicone oil, and epoxy silane. As a surface treatment method, in the case of dry fillers (i.e., in the cases of dry silica and dry alumina), a method of hydrophobizing the filler in a fluidized bed using organo halogen silane or a method of hydrophobizing organo polysiloxane using an alkaline catalyst is carried out. In the case of wet silica, a method of hydrophobizing the silica by adding a mixture containing a silylating agent, a hydrophobic organic solvent, alcohol, and water to a hydrophilic colloidal silica and aging the mixture with the silica at a temperature of 0° C. to 100° C. with the alkali removed or neutralized with an equivalent amount or more of acid.

2. Preparation of Composition

After the above-described materials were mixed together to have any of the compositions shown in Tables 1 to 3, methyl ethyl ketone and dimethylformamide were added to the mixture such that a solid content concentration was equal to or greater than 80% by mass and equal to or less than 95% by mass. Then, the mixture was stirred up with a planetary mixer. In this manner, a composition was prepared.

3. Preparation of Resin Film

A resin film having a thickness of 100 μm was made by applying the composition onto a polyethylene terephthalate film and then semi-curing the resin composition by heating the composition at about 150° C. for 3 to 5 minutes.

4. Evaluation Tests (1) Film Properties

The appearance of the resin film was inspected in a situation where the resin film was wound around an SUS rod having a diameter of 10 mm and in a situation where the resin film was wound around an SUS rod having a diameter of 100 mm.

The resin film was graded "A" if cracks were recognized on neither of these resin films wound around these rods. The resin film was graded "B" if cracks were recognized on only the resin film wound around the SUS rod having a diameter of 0 mm. The resin film was graded "C" if cracks were recognized on both of these resin films wound around these rods.

(2) Resin Flowability

The resin film was cut into the dimensions of 100 mm×100 mm in plan view to prepare test samples. Two of these samples were stacked one on top of the other and its weight was measured.

A pair of mold-released polyethylene terephthalate films were arranged such that their mold-released surfaces faced each other, and a stack of two samples was placed between the pair of mold-released polyethylene terephthalate films. In this state, the stack of samples was hot-pressed, along with the polyethylene terephthalate films, under the condition including 130° C., 5 minutes, and 0.5 MPa (Condition 1) to form a cured product out of the stack of samples. The cured product was punched out with a die to form a processed sample with a diameter of 80 mmΦ in plan view, and its weight was measured. Based on the weight $M_0$ of the sample and the weight M of the processed sample, the resin flowability was calculated by the following equation:

Resin flowability (%)=$(M_0-2M)/M_0 \times 100$

The resin flowability was also calculated in the same way in a situation where the hot pressing was carried out under the condition including 130° C., 5 minutes, and 2.0 MPa (Condition 2).

The sample was graded "A" if the resin flowability was equal to or less than 30% under the Condition 1 and greater than 45% under the Condition 2. The sample was graded "B" if the resin flowability was greater than 30% under the Condition 1 and greater than 45% under the Condition 2. The sample was graded "C" if the resin flowability was equal to or less than 30% under the Condition 1 and equal to or less than 45% under the Condition 2.

(3) Fillability

A double-sided copper-clad laminate (product number R-1566 manufactured by Panasonic Corporation; having a copper foil thickness of 35 μm) was provided. The copper foil of this double-sided copper-clad laminate was etched to form a grid of conductor wiring and thereby obtain a printed wiring board for testing. A resin film was stacked on each of the two conductor wirings of the printed wiring board and hot-pressed under the condition including 200° C., 2.94 MPa (=30 kgf/cm²), and 60 minutes to form a multilayer stack. A test was carried out in the same way in each of the three situations where the residual copper ratio of the conductor wiring was 20%, 50%, and 80% respectively.

An insulating layer formed out of the resin film of the multilayer stack was inspected, with the naked eye, to see if the insulating layer had any voids inside. The multilayer stack was graded "A" if no voids were recognized inside the insulating layer. The multilayer stack was graded "B" if any voids were recognized there.

(4) Thermal Conductivity

Eight resin films, each having a thickness of 100 μm, were stacked one on top another and the stack of these resin films was sandwiched between respective roughened surfaces of two sheets of copper foil (each having a thickness of 35 μm). The multilayer stack thus obtained was hot-pressed at 195° C. and 2.94 MPa (=30 kgf/cm²) for 60 minutes, thereby manufacturing a copper-clad laminate (CCL), of which the insulating layer had an overall thickness of 800 μm.

The sheets of copper foil were etched away from the copper-clad laminate to obtain a resin plate. The resin plate had its thermal diffusivity α estimated by laser flash method, its specific heat Cp estimated by DSC method, and its specific gravity ρ estimated by collecting gas over water. Based these results, the thermal conductivity λ was calculated by the following equation:

$$\lambda(W/m \cdot K) = \alpha(m^2/s) \times Cp(J/kg \cdot K) \times \rho(kg/m^3)$$

The results of these tests are summarized in the following Tables 1-4:

TABLE 1

| | | | Examples | | | | | | |
|---|---|---|---|---|---|---|---|---|---|
| | | | 1 | 2 | 3 | 4 | 5 | 6 | 7 |
| Composition | Epoxy resin 1 | Parts by mass | 94.0 | 94.0 | 94.0 | 94.0 | 94.0 | 94.0 | 94.0 |
| | Epoxy resin 2 | Parts by mass | | | | | | | |
| | Epoxy resin 3 | Parts by mass | | | | | | | |
| | Epoxy resin 4 | Parts by mass | | | | | | | |
| | Phenoxy resin | Parts by mass | | | | | | | |
| | Polyphenylene ether resin | Parts by mass | | | | | | | |

TABLE 1-continued

|  |  |  | Examples | | | | | | |
| --- | --- | --- | --- | --- | --- | --- | --- | --- | --- |
|  |  |  | 1 | 2 | 3 | 4 | 5 | 6 | 7 |
|  | Phenolic resin 1 | Parts by mass |  |  |  |  |  |  |  |
|  | Phenolic resin 2 | Parts by mass |  |  |  |  |  |  |  |
|  | Curing agent | Parts by mass | 6.0 | 6.0 | 6.0 | 6.0 | 6.0 | 6.0 | 6.0 |
|  | Catalyst | Parts by mass |  |  |  |  |  |  |  |
|  | Flame retardant | Parts by mass | 30.0 | 30.0 | 30.0 | 30.0 | 30.0 | 30.0 | 30.0 |
|  | Coupling agent | Parts by mass | 11.5 | 11.5 | 11.5 | 11.5 | 11.5 | 11.5 | 11.5 |
|  | Dispersant | Parts by mass | 6.9 | 6.9 | 6.9 | 6.9 | 6.9 | 6.9 | 6.9 |
|  | Leveling agent | Parts by mass | 0.6 | 0.6 | 0.6 | 0.6 | 0.6 | 0.6 | 0.6 |
|  | Anhydrous magnesium carbonate filler | Parts by mass | 540.5 | 540.5 | 540.5 | 540.5 | 540.5 | 540.5 | 540.5 |
|  | Alumina filler | Parts by mass | 552.0 | 552.0 | 552.0 | 552.0 | 552.0 | 552.0 | 552.0 |
|  | Talc | Parts by mass | 57.5 | 57.5 | 57.5 | 57.5 | 57.5 | 57.5 | 57.5 |
|  | Dry silica 1 | Parts by mass | 12.0 | 18.0 |  |  |  |  |  |
|  | Dry silica 2 | Parts by mass |  |  | 8.0 | 10.0 |  |  |  |
|  | Dry silica 3 | Parts by mass |  |  |  |  | 9.0 |  |  |
|  | Dry silica 4 | Parts by mass |  |  |  |  |  | 8.0 |  |
|  | Dry silica 5 | Parts by mass |  |  |  |  |  |  | 6.0 |
|  | Dry silica 6 | Parts by mass |  |  |  |  |  |  |  |
|  | Dry alumina | Parts by mass |  |  |  |  |  |  |  |
|  | Wet silica 1 | Parts by mass |  |  |  |  |  |  |  |
|  | Wet silica 2 | Parts by mass |  |  |  |  |  |  |  |
|  | Proportion of epoxy resin with softening point of 70° C. or less to entire epoxy resin | Mass % | 94.0 | 94.0 | 94.0 | 94.0 | 94.0 | 94.0 | 94.0 |
|  | Proportion of inorganic filler to solid content | Volume % | 73.0 | 73.2 | 72.9 | 73.0 | 73.0 | 72.9 | 72.9 |
|  | Proportion of first filler to solid content | Volume % | 71.9 | 71.5 | 72.2 | 72.0 | 72.1 | 72.2 | 72.3 |
|  | Proportion of anhydrous magnesium carbonate filler to inorganic filler | Volume % | 52.0 | 51.6 | 52.3 | 52.2 | 52.2 | 52.3 | 52.4 |
|  | Proportion of alumina filler to inorganic filler | Volume % | 40.8 | 40.5 | 41.0 | 40.9 | 40.9 | 41.0 | 41.1 |
|  | Proportion of talc to inorganic filler | Volume % | 5.6 | 5.6 | 5.6 | 5.6 | 5.6 | 5.6 | 5.7 |
|  | Proportion of second filler to solid content | Volume % | 1.2 | 1.7 | 0.8 | 1.0 | 0.9 | 0.8 | 0.6 |
|  | Proportion of second filler to solid content except inorganic filler | Volume % | 4.3 | 6.5 | 2.9 | 3.6 | 3.2 | 2.9 | 2.2 |
| Evaluation | Film properties | — | A | A | A | A | A | A | A |
|  | Resin flowability | — | A | A | A | A | A | A | A |
|  | Fillability (residual copper ratio of 20%) | — | A | A | A | A | A | A | A |
|  | Fillability (residual copper ratio of 50%) | — | A | A | A | A | A | A | A |
|  | Fillability (residual copper ratio of 80%) | — | A | A | A | A | A | A | A |
|  | Thermal conductivity | W/m · K | 2.7 | 2.7 | 2.7 | 2.7 | 2.7 | 2.7 | 2.7 |

TABLE 2

|  |  |  | Examples | | | | | |
| --- | --- | --- | --- | --- | --- | --- | --- | --- |
|  |  |  | 8 | 9 | 10 | 11 | 12 | 13 |
| Composition | Epoxy resin 1 | Parts by mass | 94.0 | 94.0 | 94.0 | 94.0 | 94.0 | 94.0 |
|  | Epoxy resin 2 | Parts by mass |  |  |  |  |  |  |
|  | Epoxy resin 3 | Parts by mass |  |  |  |  |  |  |
|  | Epoxy resin 4 | Parts by mass |  |  |  |  |  |  |
|  | Phenoxy resin | Parts by mass |  |  |  |  |  |  |
|  | Polyphenylene ether resin | Parts by mass |  |  |  |  |  |  |
|  | Phenolic resin 1 | Parts by mass |  |  |  |  |  |  |
|  | Phenolic resin 2 | Parts by mass |  |  |  |  |  |  |
|  | Curing agent | Parts by mass | 6.0 | 6.0 | 6.0 | 6.0 | 6.0 | 6.0 |
|  | Catalyst | Parts by mass |  |  |  |  |  |  |
|  | Flame retardant | Parts by mass | 30.0 | 30.0 | 30.0 | 30.0 | 30.0 | 30.0 |
|  | Coupling agent | Parts by mass | 11.5 | 11.5 | 11.5 | 11.5 | 11.5 | 11.5 |
|  | Dispersant | Parts by mass | 6.9 | 6.9 | 6.9 | 6.9 | 6.9 | 6.9 |
|  | Leveling agent | Parts by mass | 0.6 | 0.6 | 0.6 | 0.6 | 0.6 | 0.6 |
|  | Anhydrous magnesium carbonate filler | Parts by mass | 540.5 | 540.5 | 540.5 | 540.5 | 540.5 | 540.5 |

TABLE 2-continued

|  |  |  | Examples | | | | | |
| --- | --- | --- | --- | --- | --- | --- | --- | --- |
|  |  |  | 8 | 9 | 10 | 11 | 12 | 13 |
|  | Alumina filler | Parts by mass | 552.0 | 552.0 | 552.0 | 552.0 | 552.0 | 552.0 |
|  | Talc | Parts by mass | 57.5 | 57.5 | 57.5 | 57.5 | 57.5 | 57.5 |
|  | Dry silica 1 | Parts by mass |  |  |  |  |  |  |
|  | Dry silica 2 | Parts by mass |  |  |  |  |  |  |
|  | Dry silica 3 | Parts by mass |  |  |  |  |  |  |
|  | Dry silica 4 | Parts by mass |  |  |  |  |  |  |
|  | Dry silica 5 | Parts by mass | 10.0 |  |  |  |  |  |
|  | Dry silica 6 | Parts by mass |  | 8.0 |  |  |  |  |
|  | Dry alumina | Parts by mass |  |  | 15.0 | 22.0 |  |  |
|  | Wet silica 1 | Parts by mass |  |  |  |  | 4.0 |  |
|  | Wet silica 2 | Parts by mass |  |  |  |  |  | 4.0 |
|  | Proportion of epoxy resin with softening point of 70° C. or less to entire epoxy resin | Mass % | 94.0 | 94.0 | 94.0 | 94.0 | 94.0 | 94.0 |
|  | Proportion of inorganic filler to solid content | Volume % | 73.0 | 72.9 | 72.9 | 73.0 | 72.8 | 72.8 |
|  | Proportion of first filler to solid content | Volume % | 72.0 | 72.2 | 72.1 | 71.9 | 72.4 | 72.4 |
|  | Proportion of anhydrous magnesium carbonate filler to inorganic filler | Volume % | 52.2 | 52.3 | 52.3 | 52.0 | 52.6 | 52.6 |
|  | Proportion of alumina filler to inorganic filler | Volume % | 40.9 | 41.0 | 41.0 | 40.8 | 41.2 | 41.2 |
|  | Proportion of talc to inorganic filler | Volume % | 5.6 | 5.6 | 5.6 | 5.6 | 5.7 | 5.7 |
|  | Proportion of second filler to solid content | Volume % | 1.0 | 0.8 | 0.8 | 1.2 | 0.4 | 0.4 |
|  | Proportion of second filler to solid content except inorganic filler | Volume % | 3.6 | 2.9 | 3.0 | 4.4 | 1.4 | 1.4 |
| Evaluation | Film properties | — | A | A | A | A | A | A |
|  | Resin flowability | — | A | A | A | A | A | A |
|  | Fillability (residual copper ratio of 20%) | — | A | A | A | A | A | A |
|  | Fillability (residual copper ratio of 50%) | — | A | A | A | A | A | A |
|  | Fillability (residual copper ratio of 80%) | — | A | A | A | A | A | A |
|  | Thermal conductivity | W/m · K | 2.7 | 2.7 | 2.7 | 2.7 | 2.7 | 2.7 |

TABLE 3

|  |  |  | Examples | | | | | |
| --- | --- | --- | --- | --- | --- | --- | --- | --- |
|  |  |  | 14 | 15 | 16 | 17 | 18 | 19 |
| Composition | Epoxy resin 1 | Parts by mass | 94.0 | 25.0 |  |  |  | 47.0 |
|  | Epoxy resin 2 | Parts by mass |  | 70.0 |  |  |  |  |
|  | Epoxy resin 3 | Parts by mass |  |  | 95.5 | 76.5 | 15.0 |  |
|  | Epoxy resin 4 | Parts by mass |  |  |  |  | 35.0 |  |
|  | Phenoxy resin | Parts by mass |  |  |  | 20.0 |  |  |
|  | Polyphenylene ether resin | Parts by mass |  |  |  |  | 50.0 |  |
|  | Phenolic resin 1 | Parts by mass |  |  |  |  |  | 25.0 |
|  | Phenolic resin 2 | Parts by mass |  |  |  |  |  | 28.0 |
|  | Curing agent | Parts by mass | 6.0 | 5.0 | 4.5 | 3.5 |  |  |
|  | Catalyst | Parts by mass |  |  |  |  | 0.2 | 0.1 |
|  | Flame retardant | Parts by mass | 30.0 | 30.0 | 30.0 | 30.0 | 30.0 |  |
|  | Coupling agent | Parts by mass | 4.5 | 11.5 | 11.5 | 11.5 | 11.5 | 9.1 |
|  | Dispersant | Parts by mass | 2.7 | 6.9 | 6.9 | 6.9 | 6.9 | 5.5 |
|  | Leveling agent | Parts by mass | 0.6 | 0.6 | 0.6 | 0.6 | 0.6 | 0.6 |
|  | Anhydrous magnesium carbonate filler | Parts by mass | 211.5 | 540.5 | 540.5 | 540.5 | 540.5 | 427.7 |
|  | Alumina filler | Parts by mass | 216.0 | 552.0 | 552.0 | 552.0 | 552.0 | 436.8 |
|  | Talc | Parts by mass | 22.5 | 57.5 | 57.5 | 57.5 | 57.5 | 45.5 |
|  | Dry silica 1 | Parts by mass |  |  |  |  |  |  |
|  | Dry silica 2 | Parts by mass | 8.0 |  |  |  |  |  |
|  | Dry silica 3 | Parts by mass |  |  |  |  |  |  |
|  | Dry silica 4 | Parts by mass |  |  |  |  |  |  |
|  | Dry silica 5 | Parts by mass |  |  |  |  |  |  |
|  | Dry silica 6 | Parts by mass |  |  |  |  |  |  |
|  | Dry alumina | Parts by mass |  | 15.0 |  |  |  |  |
|  | Wet silica 1 | Parts by mass |  |  | 4.0 | 4.0 | 4.0 | 4.0 |
|  | Wet silica 2 | Parts by mass |  |  |  |  |  | 4.0 |

TABLE 3-continued

|  |  |  | Examples | | | | | |
| --- | --- | --- | --- | --- | --- | --- | --- | --- |
|  |  |  | 14 | 15 | 16 | 17 | 18 | 19 |
|  | Proportion of epoxy resin with softening point of 70° C. or less to entire epoxy resin | Mass % | 94.0 | 25.0 | 95.5 | 76.5 | 50.0 | 47.0 |
|  | Proportion of inorganic filler to solid content | Volume % | 54.1 | 72.9 | 72.3 | 72.4 | 71.4 | 73.1 |
|  | Proportion of first filler to solid content | Volume % | 52.6 | 72.1 | 71.9 | 72.0 | 71.0 | 72.6 |
|  | Proportion of anhydrous magnesium carbonate filler to inorganic filler | Volume % | 51.4 | 52.3 | 52.6 | 52.6 | 52.6 | 52.5 |
|  | Proportion of alumina filler to inorganic filler | Volume % | 40.3 | 41.0 | 41.2 | 41.2 | 41.2 | 41.2 |
|  | Proportion of talc to inorganic filler | Volume % | 5.5 | 5.6 | 5.7 | 5.7 | 5.7 | 5.7 |
|  | Proportion of second filler to solid content | Volume % | 1.5 | 0.8 | 0.4 | 0.4 | 0.4 | 0.5 |
|  | Proportion of second filler to solid content except inorganic filler | Volume % | 3.2 | 3.0 | 1.4 | 1.4 | 1.3 | 1.8 |
| Evaluation | Film properties | — | A | C | A | A | B | B |
|  | Resin flowability | — | A | A | A | A | A | A |
|  | Fillability (residual copper ratio of 20%) | — | A | A | A | A | A | A |
|  | Fillability (residual copper ratio of 50%) | — | A | A | A | A | A | A |
|  | Fillability (residual copper ratio of 80%) | — | A | A | A | A | A | A |
|  | Thermal conductivity | W/m · K | 1.7 | 2.7 | 2.7 | 2.7 | 2.6 | 2.7 |

TABLE 4

|  |  |  | Comparative examples | | | |
| --- | --- | --- | --- | --- | --- | --- |
|  |  |  | 1 | 2 | 3 | 4 |
| Composition | Epoxy resin 1 | Parts by mass | 94.0 | 94.0 | 94.0 | 94.0 |
|  | Epoxy resin 2 | Parts by mass |  |  |  |  |
|  | Epoxy resin 3 | Parts by mass |  |  |  |  |
|  | Epoxy resin 4 | Parts by mass |  |  |  |  |
|  | Phenoxy resin | Parts by mass |  |  |  |  |
|  | Polyphenylene ether resin | Parts by mass |  |  |  |  |
|  | Phenolic resin 1 | Parts by mass |  |  |  |  |
|  | Phenolic resin 2 | Parts by mass |  |  |  |  |
|  | Curing agent | Parts by mass | 6.0 | 6.0 | 6.0 | 6.0 |
|  | Catalyst | Parts by mass |  |  |  |  |
|  | Flame retardant | Parts by mass | 30.0 | 30.0 | 30.0 | 30.0 |
|  | Coupling agent | Parts by mass | 11.5 | 11.5 | 11.5 | 5.5 |
|  | Dispersant | Parts by mass | 6.9 | 6.9 | 6.9 | 3.3 |
|  | Leveling agent | Parts by mass | 0.6 | 0.6 | 0.6 | 0.6 |
|  | Anhydrous magnesium carbonate filler | Parts by mass | 540.5 | 540.5 | 540.5 | 550.0 |
|  | Alumina filler | Parts by mass | 552.0 | 552.0 | 552.0 |  |
|  | Talc | Parts by mass | 57.5 | 57.5 | 57.5 |  |
|  | Dry silica 1 | Parts by mass |  | 28.0 |  |  |
|  | Dry silica 2 | Parts by mass |  |  | 25.0 | 8.0 |
|  | Dry silica 3 | Parts by mass |  |  |  |  |
|  | Dry silica 4 | Parts by mass |  |  |  |  |
|  | Dry silica 5 | Parts by mass |  |  |  |  |
|  | Dry silica 6 | Parts by mass |  |  |  |  |
|  | Dry alumina | Parts by mass |  |  |  |  |
|  | Wet silica 1 | Parts by mass |  |  |  |  |
|  | Wet silica 2 | Parts by mass |  |  |  |  |
|  | Proportion of epoxy resin with softening point of 70° C. or less to entire epoxy resin | Mass % | 94.0 | 94.0 | 94.0 | 94.0 |
|  | Proportion of inorganic filler to solid content | Volume % | 72.7 | 73.5 | 73.4 | 61.3 |
|  | Proportion of first filler to solid content | Volume % | 72.7 | 70.8 | 71.0 | 60.1 |
|  | Proportion of anhydrous magnesium carbonate filler to inorganic filler | Volume % | 52.9 | 50.9 | 51.1 | 98.0 |

TABLE 4-continued

|  |  |  | Comparative examples | | | |
|---|---|---|---|---|---|---|
|  |  |  | 1 | 2 | 3 | 4 |
|  | Proportion of alumina filler to inorganic filler | Volume % | 41.4 | 39.9 | 40.1 | — |
|  | Proportion of talc to inorganic filler | Volume % | 5.7 | 5.5 | 5.5 | — |
|  | Proportion of second filler to solid content | Volume % | — | 2.7 | 2.4 | 1.2 |
|  | Proportion of second filler to solid content except inorganic filler | Volume % | — | 10.1 | 9.0 | 3.1 |
| Evaluation | Film properties | — | A | C | C | A |
|  | Resin flowability | — | B | C | C | A |
|  | Fillability (residual copper ratio of 20%) | — | A | C | C | A |
|  | Fillability (residual copper ratio of 50%) | — | A | C | C | A |
|  | Fillability (residual copper ratio of 80%) | — | A | C | C | A |
|  | Thermal conductivity | W/m·K | 2.7 | — | — | 1.6 |

REFERENCE SIGNS LIST

1 Resin Film
2 Sheet of Metal Foil with Resin
20 Resin Layer
21 Sheet of Metal Foil
3 Prepreg
31 Base Member
4 Metal-Clad Laminate
40 Insulating Layer
41 Sheet of Metal Foil
5 Printed Wiring Board
50 Insulating Layer
51 Conductor Layer

The invention claimed is:

1. A resin composition containing a thermosetting resin (A) and an inorganic filler (B),
the inorganic filler (B) including: a first filler (B1); and a second filler (B2) of a nanometer scale having a smaller particle size than the first filler (B1),
the first filler (B1) including an anhydrous magnesium carbonate filler (b1) and an alumina filler (b2),
proportion of the first filler (B1) relative to a total solid content in the resin composition being equal to or greater than 50% by volume and equal to or less than 90% by volume,
proportion of the second filler (B2) relative to the total solid content in the resin composition being equal to or greater than 0.1% by volume and equal to or less than 2.0% by volume.

2. The resin composition of claim 1, wherein
proportion of the second filler (B2) relative to the solid content except the inorganic filler (B) is equal to or greater than 1.0% by volume and equal to or less than 8.0% by volume.

3. The resin composition of claim 1, wherein
proportion of the anhydrous magnesium carbonate filler (b1) relative to the inorganic filler (B) is equal to or greater than 25% by volume and equal to or less than 75% by volume.

4. The resin composition of claim 1, wherein
a median diameter of the anhydrous magnesium carbonate filler (b1) is equal to or greater than 8 μm and equal to or less than 30 μm when measured by laser diffraction and scattering method, and
a median diameter of the alumina filler (b2) is equal to or greater than 0.1 μm and equal to or less than 5 μm when measured by the laser diffraction and scattering method.

5. The resin composition of claim 1, wherein
a specific surface area of the second filler (B2) is equal to or greater than 100 m$^2$/g and equal to or less than 400 m$^2$/g when measured by BET method.

6. The resin composition of claim 1, wherein
the second filler (B2) is treated with at least one surface treatment agent selected from the group consisting of alkyl silane, silicone oil, epoxy silane, amino silane, isocyanate silane, and acid anhydride silane.

7. The resin composition of claim 1, wherein
the thermosetting resin (A) contains an epoxy resin (a), and
the epoxy resin (a) includes an epoxy resin (a1) having a softening point equal to or lower than 75° C., proportion of the epoxy resin (a1) relative to the epoxy resin (a) being equal to or greater than 30% by mass.

8. A resin film containing the resin composition of claim 1, a dried product of the resin composition, or a semi-cured product of the resin composition.

9. A sheet of metal foil with resin, comprising:
a resin layer containing the resin composition of claim 1, a dried product of the resin composition, or a semi-cured product of the resin composition; and
a sheet of metal foil stacked on the resin layer.

10. A prepreg comprising:
a base member; and
the resin composition of claim 1, a dried product of the resin composition, or a semi-cured product of the resin composition, any of which is impregnated into the base member.

11. A metal-clad laminate comprising:
an insulating layer containing a cured product of the resin composition of claim 1; and
a sheet of metal foil stacked on the insulating layer.

12. A printed wiring board comprising:
an insulating layer containing a cured product of the resin composition of claim 1; and
a conductor layer stacked on the insulating layer.

13. The resin composition of claim 2, wherein
proportion of the anhydrous magnesium carbonate filler (b1) relative to the inorganic filler (B) is equal to or greater than 25% by volume and equal to or less than 75% by volume.

14. The resin composition of claim 2, wherein
a median diameter of the anhydrous magnesium carbonate filler (b1) is equal to or greater than 8 μm and equal to or less than 30 μm when measured by laser diffraction and scattering method, and
a median diameter of the alumina filler (b2) is equal to or greater than 0.1 μm and equal to or less than 5 μm when measured by the laser diffraction and scattering method.

15. The resin composition of claim 2, wherein
a specific surface area of the second filler (B2) is equal to or greater than 100 m$^2$/g and equal to or less than 400 m$^2$/g when measured by BET method.

16. The resin composition of claim 2, wherein
the second filler (B2) is treated with at least one surface treatment agent selected from the group consisting of alkyl silane, silicone oil, epoxy silane, amino silane, isocyanate silane, and acid anhydride silane.

17. The resin composition of claim 2, wherein
the thermosetting resin (A) contains an epoxy resin (a), and
the epoxy resin (a) includes an epoxy resin (a1) having a softening point equal to or lower than 75° C., proportion of the epoxy resin (a1) relative to the epoxy resin (a) being equal to or greater than 30% by mass.

18. The resin composition of claim 3, wherein
a median diameter of the anhydrous magnesium carbonate filler (b1) is equal to or greater than 8 μm and equal to or less than 30 μm when measured by laser diffraction and scattering method, and
a median diameter of the alumina filler (b2) is equal to or greater than 0.1 μm and equal to or less than 5 μm when measured by the laser diffraction and scattering method.

19. The resin composition of claim 3, wherein
a specific surface area of the second filler (B2) is equal to or greater than 100 m$^2$/g and equal to or less than 400 m$^2$/g when measured by BET method.

20. The resin composition of claim 3, wherein
the second filler (B2) is treated with at least one surface treatment agent selected from the group consisting of alkyl silane, silicone oil, epoxy silane, amino silane, isocyanate silane, and acid anhydride silane.

* * * * *